(12) United States Patent
Svilans

(10) Patent No.: US 6,542,534 B1
(45) Date of Patent: Apr. 1, 2003

(54) FIELD-PROGRAMMABLE OPTICAL SOURCE

(75) Inventor: Mikelis Svilans, Kanata (CA)

(73) Assignee: JDS Uniphase Corporation, San Jose, CA (US)

( * ) Notice: Subject to any disclaimer, the term of this patent is extended or adjusted under 35 U.S.C. 154(b) by 163 days.

(21) Appl. No.: 09/707,383

(22) Filed: Nov. 8, 2000

(51) Int. Cl.$^7$ ................................................ H10S 3/13
(52) U.S. Cl. ........................................ 372/92; 372/20
(58) Field of Search ........................... 372/20, 101, 102

(56) References Cited

U.S. PATENT DOCUMENTS

| | | | | |
|---|---|---|---|---|
| 5,142,303 A | * | 8/1992 | Nelson | 347/239 |
| 5,634,737 A | * | 6/1997 | Voss et al. | 403/348 |
| 5,661,835 A | * | 8/1997 | Kato et al. | 385/33 |
| 5,832,011 A | | 11/1998 | Kashyap | |
| 5,960,139 A | * | 9/1999 | Henning | 385/60 |
| 6,041,069 A | * | 3/2000 | Kashyap et al. | 372/102 |
| 6,272,157 B1 | * | 8/2001 | Broutin et al. | 372/101 |
| 6,327,287 B1 | * | 12/2001 | Kner et al. | 372/20 |
| 6,370,290 B1 | * | 4/2002 | Ball et al. | 385/14 |
| 6,374,015 B1 | * | 4/2002 | Lin | 385/37 |

* cited by examiner

Primary Examiner—Paul Ip
Assistant Examiner—Dung Nguyen
(74) Attorney, Agent, or Firm—Allen, Dyer, Doppelt, Milbrath & Gilchrist, P.A.

(57) ABSTRACT

An optical source with a light output which may be set to a desired wavelength out of a specified range of wavelengths is described. This optical source includes a housing and a laser arrangement for causing light to lase over the specified range of wavelengths. The laser arrangement is supported in the housing such that a light path is defined in the housing along which light path the specified range of wavelengths is potentially producible. The optical source further includes at least one tuning cartridge for setting the light output of the optical source to the desired wavelength out of the specified range of wavelengths. The tuning cartridge in turn includes a wavelength selective element and is configured to cooperate with said housing in a way which positions the wavelength selective element in the light path to set the light output of the optical source to the desired wavelength out of the specified range of wavelengths.

40 Claims, 5 Drawing Sheets

FIELD-PROGRAMMABLE OPTICAL SOURCE

BACKGROUND OF THE INVENTION

The present invention relates generally to optical devices and, more particularly, to optical sources with optical outputs, the specific output wavelengths of which are user selectable.

With the development of dense wavelength-division multiplexing (DWDM) technology for telecommunications, there is a growing interest in an optical source with an optical output that is wavelength-tunable and is also stable once the optical output has been tuned to a desired wavelength. In a multi-channel, DWDM telecommunication system, a distinct wavelength is assigned to each channel and the number of available channels in a telecommunication bandwidth is dependent on the linewidth (i.e., a narrow range of wavelengths around the assigned wavelength) of the optical signal used at each channel. In order to increase the number of channels which can be fitted into the available bandwidth, the range of wavelengths at each channel must be decreased. The standard channel range used in the telecommunications industry is less than 0.8 nm per channel (corresponding to 100 GHz at 1550 nm) and is further decreasing. In the DWDM system, any instability in the optical source larger than the channel range will result in communication error. To avoid such error, the optical output of the optical source used at each channel must be stable in wavelength within the assigned channel range.

The increase in the number of channels also creates a problem in that the number of optical sources forming a DWDM transmitter is also increased. In general, optical sources generate heat as well as light and the optical output of optical sources tend to depend on temperature. Therefore, instability in certain optical sources is exacerbated by the increased number of optical sources in close proximity within the DWDM transmitter. Supplementary components, packaging, and circuitry are needed in order to effectively control the temperature of each optical source, thus adding to the cost of the DWDM transmitter.

Many of the existing DWDM systems use a series of distributed feedback (DFB) lasers as the optical sources in the DWDM transmitter. A DFB laser is normally designed and manufactured for a specific optical wavelength. Its output wavelength is partly stabilized by a temperature control apparatus using feedback circuitry which monitors the output wavelength of the optical source and regulates the temperature control apparatus accordingly. Since the output wavelength of a DFB laser is further dependent on the input current, the feedback circuitry may regulate the current supply of the DFB laser as well. Essentially, the feedback circuitry serves as a frequency locker that locks the output frequency, which corresponds to the output wavelength, of the DFB laser at a particular value. Due to its dependence on temperature and input current, the output wavelength of the DFB laser can be tuned over a narrow wavelength range of 5 to 8 nm by controlling the temperature of the DFB laser and the current supplied to the laser. Once tuned to a specific wavelength, the wavelength stability of a DFB laser output is approximately −12.5 GHz/° C. (or correspondingly +0.1 nm/° C.) with respect to case temperature and −1.25 GHz/mA (or correspondingly +0.01 nm/mA) with respect to bias current.

There are, however, drawbacks to the use of DFB lasers in a DWDM system. The fabrication of a DFB laser is a lengthy process requiring the formation of a sub-micron, periodic structure within a multilayer semiconductor structure to act as a wavelength-selective grating element. The output wavelength of the DFB laser is heavily dependent on the shape and periodicity of the periodic structure, hence precision of the fabrication process is crucial. Although many essentially identical DFB laser chips can be produced during a single fabrication run, DFB laser chips for different output wavelengths are normally fabricated separately. Consequently, the production of a DFB laser for a given output wavelength often necessitates a long lead time once the output wavelength has been specified to the manufacturer. The production of a series of DFB lasers for a complete DWDM system can take even longer, requiring many production runs since each channel of a DWDM system requires its own DFB laser.

Furthermore, due to the relatively high temperature coefficient of semiconductor laser materials, the feedback circuitry and temperature and current controllers discussed in the above paragraph are required to control the actual output wavelength even after the DFB laser chip has been fabricated using high precision processes. For the DFB laser to be useful in a DWDM context, an external wavelength reference must also be supplied to accurately regulate the output wavelength. Additionally, since the power output of the DFB laser is proportional to the input current and the feedback circuitry regulates the input current in order to control the output wavelength of the laser, the actual power output of a particular DFB laser is limited by the need for output wavelength stabilization. Due to such difficulty in directly controlling output power, an external attenuator is often needed at each channel in order to achieve uniform optical power output across the channels in a WDM transmitter system using a series of DFB lasers. In addition to input current control, the DFB laser requires the use of active heating and cooling measures using the aforementioned temperature control apparatus. Hence, a separate output wavelength regulation mechanism, which adds to the power consumption of the DFB laser operation, is needed for each laser used in the DWDM system with respect to temperature and input current. Moreover, in order to reduce frequency chirp often produced by the direct modulation mechanism, the DFB laser output must be modulated externally. Therefore, although each DFB laser chip is relatively inexpensive, the peripheral equipment such as the temperature control apparatus, controllable current supply, external attenuators, feedback circuitry and external modulator significantly add to the complication and total cost of a multi-channel DWDM system using such lasers.

Another commercially-available device which could be used as an optical source in a DWDM system is a tunable diode laser. For example, one type of tunable laser is based on a mechanical tuning scheme where one of the mirrors which form the laser cavity is physically moved to change the grazing angle at which an optical input from a separate diode laser is incident on a bulk grating in the laser cavity, thus changing the wavelength of the optical output of the tunable laser. Tunable lasers can generally be tuned over a wavelength range of 40 to 80 nm and are often used in optical component testing in a scanning mode where the output of the tunable laser is scanned over a part of or the entire wavelength range to test the wavelength-dependent response of an optical device. However, the precision actuators and components within a tunable laser as well as the laser controller mechanism and software are generally expensive. For example, tunable lasers currently on the market cost tens of thousands of dollars each at the time of this writing (typically $35,000 to $63,000 for laboratory instruments). Furthermore, since each channel in a DWDM system is preassigned to a specific wavelength, the optical source used at each channel needs to be tuned only to that specific wavelength at time of installation. The wavelength of a given channel may be re-assigned on occasion, but, on the whole, the optical source is made to operate at a single wavelength without the need for wavelength scanning. Therefore, the precision actuators and other tuning components of the tunable laser are generally superfluous once the laser has been tuned to the specific wavelength for a given channel. Moreover, currently available tunable lasers are relatively large compared to compact semiconductor lasers. For these reasons, it is submitted to be impractical to provide a tunable laser for each channel of a DWDM system which may include a hundred or more distinct channels.

Yet another prior art optical source for use in an optical communication system is a laser disclosed in U.S. Pat. No. 5,832,011 issued to Kashyap (hereinafter the '011 patent). The laser according to the '011 patent is essentially a laser with an interchangeable fiber grating serving as one or both of the reflectors forming the laser cavity. The wavelength of light reflected by the fiber grating depends on the grating pitch. Therefore, the output wavelength of the laser can be tuned to a desired wavelength by fabricating a series of fiber gratings of different pitch and then selecting the appropriate fiber grating tuned to reflect the desired wavelength for use in a particular laser. The laser gain material is mounted in a package including a pre-aligned connector receptacle configured for matingly attaching the fiber grating using an optical connector. That is, an optical connector is interposed between the fiber grating and the laser gain material. By selecting a fiber grating tuned to a desired wavelength and attaching the selected fiber grating to the package using an optical connector via the pre-aligned connector receptacle, it is possible to produce lasing action at the desired wavelength thus setting the light output of this prior art laser to the desired wavelength.

It is submitted, however, that the prior art laser of the '011 patent does have a number of disadvantages. Due to the length of the fiber grating and the package configuration, the actual cavity length of this prior art laser is much longer as compared with those generally seen in semiconductor lasers. The longer cavity length leads to potential problems such as slower possible laser modulation speed which, in turn, limits data transmission capacity. Also, once a particular fiber grating is selected and installed, it is difficult to adjust the output wavelength short of replacing the fiber grating with another fiber grating tuned to a slightly different wavelength.

Possibly the most significant drawback of the prior art laser of the '011 patent is the presence of at least one optical connector cooperating with the package and fiber grating to define the laser cavity. It is well known in the art that optical connectors can be notoriously unreliable. They are submitted to be susceptible to mechanical damage and introduce difficulty in achieving repeatable connections. In the instance of the '011 patent, it is submitted that the optical connector may cause spurious reflections in the laser cavity, thus reducing the repeatability of the reflectivity level of the fiber grating and optical connector combination and negatively affecting the light output of the laser. Furthermore, the use of an optical fiber as a waveguiding medium within the optical cavity may give rise to instability in the laser performance due to polarization effects such as polarization-dependent loss and induced changes in polarization state of light within the laser cavity. Further, it is difficult to control the polarization of light traveling through an ordinary optical fiber. Resolving adverse polarization effects may require the use of additional in-line polarizers or polarization maintaining optical fibers.

The present invention provides an optical source which serves to resolve the problems described above with regard to prior art optical sources in a heretofore unseen and highly advantageous way and which provides still further advantages.

SUMMARY OF THE INVENTION

As will be described in more detail hereinafter, there is disclosed herein an optical source with a light output which may be set to a desired wavelength out of a specified range of wavelengths. In one aspect of the invention, the optical source includes a housing and a laser arrangement for causing light to lase over the specified range of wavelengths. The laser arrangement is supported in the housing such that a light path is defined in the housing along which light path the specified range of wavelengths is potentially producible. The optical source further includes at least one tuning cartridge for setting the light output of the optical source to the desired wavelength out of the specified range of wavelengths using a wavelength selective element. The tuning cartridge is configured to cooperate with the housing in a way which positions the wavelength selective element in the light path, thus setting the light output of the optical source to the desired wavelength out of the specified range of wavelengths.

In another aspect of the invention, the optical source has a selectable light output and includes a housing with first and second reflective arrangements supported in the housing and defining therebetween a light path and a laser cavity. The second reflective arrangement is partially reflective over a specified range of wavelengths. The optical source further includes a gain medium positioned in the laser cavity within the light path and designed to provide optical gain over the specified range of wavelengths such that the specified range of wavelengths is potentially producible along the light path. Additionally, the optical source includes at least one tuning cartridge which in turn includes an optical element. The tuning cartridge is configured to cooperate with the housing for removably positioning the optical element within the light path to set the selectable light output to a predetermined wavelength that is selected within the specified range of wavelengths.

In yet another aspect of the invention, a method for providing a reconfigurable optical source with a light output settable to a desired wavelength out of a specified range of wavelengths, as described above, is disclosed. Accordingly, a laser arrangement is formed in a housing such that a light path is defined in the housing along which light path the specified range of wavelengths is potentially producible. A series of tuning cartridges is fabricated each of which includes a wavelength selective element such that each tuning cartridge is tunable to at least one wavelength out of the specified range of wavelengths. Each of the wavelengths in the specified range of wavelengths may be selected as the desired wavelength. Each tuning cartridge is configured to cooperate with the housing in a way which positions the wavelength selective element of that tuning cartridge in the light path to set the light output of the reconfigurable optical source to the desired wavelength.

In still another aspect of the invention, the optical source as described above is used in a DWDM system including a plurality of DWDM channels, each DWDM channel corresponding to a predetermined wavelength out of a specified range of wavelengths. A selected DWDM channel out of the plurality of DWDM channels is configured to a desired wavelength by installing a laser arrangement in the selected DWDM channel. The laser arrangement includes a housing and potentially produces the specified range of wavelengths along a light path defined by the laser arrangement. A specific tuning cartridge, which is tuned to the desired wavelength, is selected out of a series of tuning cartridges. Each tuning cartridge of the series of tuning cartridges includes an optical element such that the tuning cartridge is tunable to at least one wavelength out of the specified range of wavelengths. Furthermore, each tuning cartridge is configured to cooperate with the housing in a way which positions the optical element of that tuning cartridge in the light path. The selected DWDM channel is set to the desired wavelength by engaging the specific tuning cartridge with the housing in a predetermined way.

BRIEF DESCRIPTION OF THE DRAWINGS

The present invention may be understood by reference to the following detailed description taken in conjunction with the drawings briefly described below.

DETAILED DESCRIPTION OF THE PRESENT INVENTION

Figure 1:
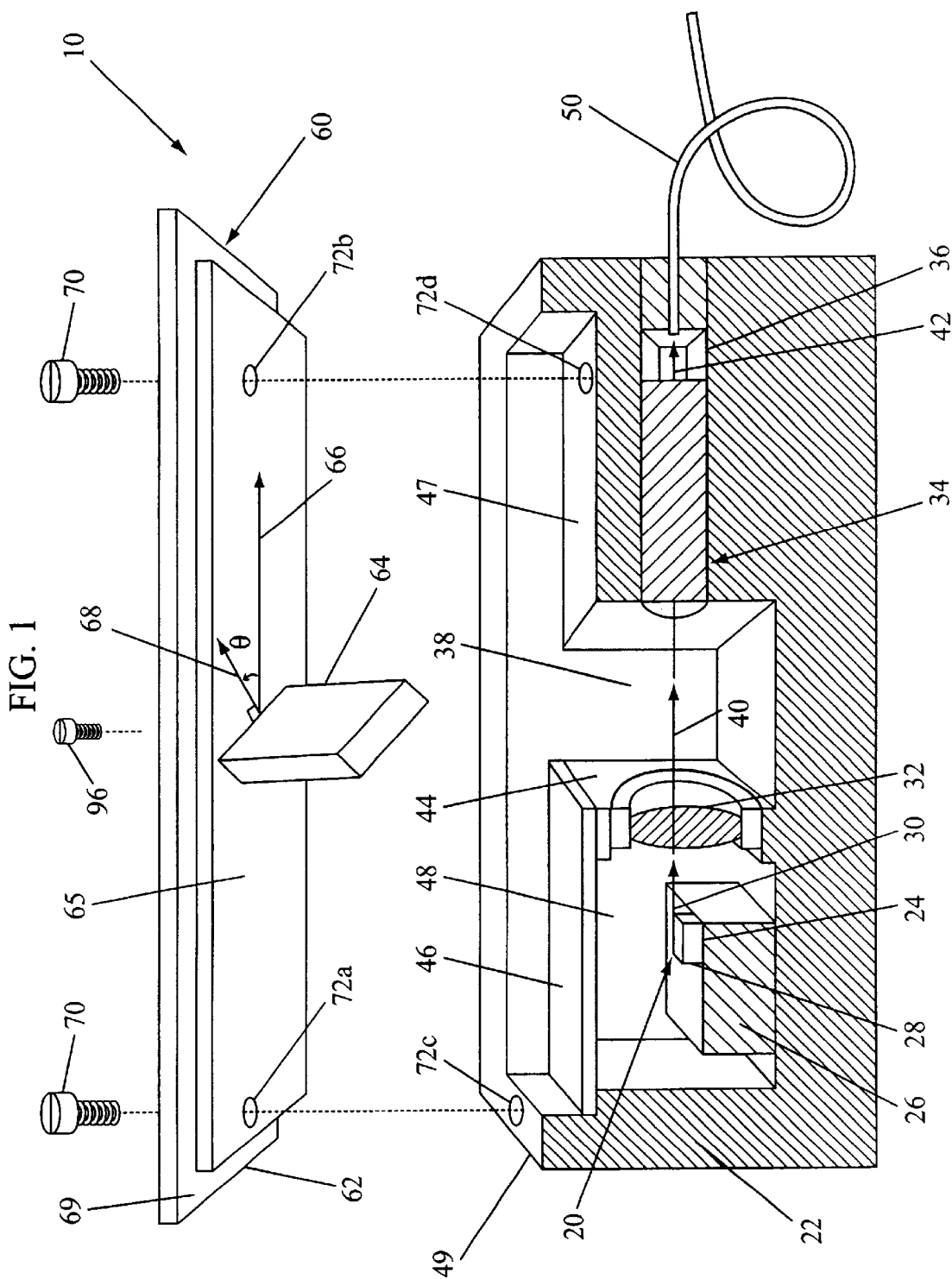
FIG. 1 is a diagrammatic perspective view, in cross-section, of one embodiment of an optical source manufactured in accordance with the present invention shown here to illustrate the internal structure of the optical source.

Turning now to the drawings, wherein like components are indicated by like reference numbers throughout the various figures, attention is immediately directed to FIG. 1, which illustrates one embodiment of an optical source, generally indicated by the reference number 10. Optical source 10 includes a laser assembly 20. Laser assembly 20 is supported using a housing 22. Housing 22 may be fabricated, for example, by molding a monolithic material. A housing may also be machined from a solid material for mechanical stability. Suitable housing materials include, but are not limited to metal alloys, resins and high stability plastics. A semiconductor laser chip 24 is supported on a laser submount 26 attached near one end of housing 22. Laser chip 24 is designed to provide optical gain over a specified range of wavelengths. Alternatively, another suitable gain material, such as an optical fiber amplifier, may be used in place of laser chip 24. Laser submount 26 may contain electronic circuitry and connections for controlling the behavior of laser chip 24. External electrical connections may he made to the laser chip via the submount, for example, by electrical contact pins. These connections are not specifically illustrated since it is considered that one of ordinary skill in the art may accomplish the appropriate connections. Laser chip 24 has a high reflector coating (not visible) on a first end 28 and an anti-reflection coating (not visible) on an opposing, second end 30. The high reflector coating on first end 28 is designed to be highly reflective to light over the previously mentioned, specified range of wavelengths, and the anti-reflection coating on second end 30 is intended to be highly transmissive to light over the specified range of wavelengths.

Laser chip 24 is mounted on laser submount 26 in such a way that the anti-reflection coating on second end 30 points toward a collimating lens 32. An opposing end of housing 22 supports a retroreflector assembly 34. The latter includes an end reflector 36 (not visible) that is at least partially reflective to light over the specified range of wavelengths. High reflector coating on first end 28 of laser chip 24 and end reflector 36 together define a laser cavity 38 and a light path 40 therein. It is to be understood that the line shown in FIG. 1 corresponding to light path 40 as well as all other lines subsequently used to depict light paths through the optical source are illustrative only and are not intended to represent a ray trace as is commonly performed in the course of an optical design. Laser cavity 38 cooperates with laser chip 24 to potentially produce light within the specified range of wavelengths along light path 40. That is, when electrical power is supplied to laser chip 24 through laser submount 26, laser chip 24 provides optical gain over the specified range of wavelengths and the high reflector coating on first end 28 and end reflector 36 together provide an optical feedback effect over the same specified range of wavelengths such that lasing action can be produced along light path 40 at any wavelength within the specified range of wavelengths in the absence of additional optical components. As will be described hereinafter, the specific wavelength at which lasing action is produced is selected and set to a desired wavelength by the manufacturer or user in accordance with the present invention. An optical output 42 resulting from the lasing action is then extracted from laser cavity 38 through partially reflective, end reflector 36.

Continuing to refer to FIG. 1, collimating lens 32 is mounted in a partition 44 which is integrally formed with housing 22. A hermetic lid 46 is attached to housing 22 so as to cooperate with partition 44 to form an enclosed chamber 48. Enclosed chamber 48 serves to isolate laser chip 24 and laser submount 26 from the surroundings so as to protect them from changes in the environment such as the presence of heat or moisture. Enclosure of the laser chip may be accomplished using alternative structures so long as the laser chip is sufficiently protected. Retroreflector assembly 34 is positioned spaced apart from collimating lens 32 and enclosed chamber 48. The retroreflector assembly may be mounted, for example, by inserting it into a pre-molded mounting hole or in a mounting hole formed, for instance, by boring through a portion of housing 22 then securing the position of retroreflector assembly in housing 22 in a suitable manner, for example, using an optical epoxy. A fiber pigtail 50 is attached to housing 22 and aligned in such a way that optical output 42 is coupled into fiber pigtail 50 to be guided to another optical device.

Optical source 10 shown in FIG. 1 also includes a microcartridge 60. The latter consists of a cover 62 and a wavelength selective element 64 which is attached to cover 62. Wavelength selective element 64 may be a suitable passive dielectric filter or equivalent thereof. For example, thin film WDM filters and other filters such as a single cavity filter with a narrow, single transmission peak which is commonly utilized in telecommunications applications may be used. State of the art thin film filters with low thermal coefficients are particularly suited for use as wavelength selective element 64. Wavelength selective element 64 is mounted on an inner surface 65 of cover 62 at a preset angle θ, which is defined as the angle between a line 66 parallel to light path 40 (with the microcartridge attached to the housing) and a surface normal 68 of wavelength selective element 64. Microcartridge 60 is designed to cooperate with housing 22 in such a way that, when microcartridge 60 is mated with housing 22, the two define an overall outline of optical source 10 such that wavelength selective element 64 is positioned with a degree of precision in light path 40 in laser cavity 38. Microcartridge 60 can be attached to housing 22 using, for example, microscrews 70 through matching holes 72a–d defined through cover 62 and housing 22. Preset angle θ is chosen such that optical output 42 is set to a desired wavelength out of the specified range of wavelengths when wavelength selective element 64 is positioned in light path 40. The alignment tolerance in positioning wavelength selective element 64 on microcartridge 60 is comparable to that seen in a prior art fiber pigtailing procedure and is submitted to be within the capability of an optics assembly technician having ordinary skill in the art.

It should be emphasized that, given an implementation of laser assembly 20, which is designed to be capable of producing lasing action over the specified range of wavelengths, the particular optical properties of wavelength selective element 64 and preset angle θ on microcartridge 60 are the primary variables that set the wavelength of optical output 42. Therefore, the wavelength of optical output 42 is set to another wavelength in the specified range of wavelengths by using an alternative microcartridge (not shown) with another wavelength selective element oriented at a different preset angle or made with an optical element of different optical properties. Accordingly, a series of microcartridges with different preset angles and thickness of wavelength selective elements is fabricated for use with one or more identical laser assemblies such that each microcartridge, when mated with housing 22 of a given laser assembly, sets optical output 42 of the resulting optical source at a distinct wavelength out of the specified range of wavelengths. In other words, the wavelength of optical output 42 is set to any desired wavelength in the specified range of wavelengths by selecting the appropriate microcartridge and engaging it with housing 22 supporting laser assembly 20 without a need to otherwise alter laser assembly 20. It is submitted that this feature of optical source 10 is highly advantageous in at least one respect since the parts of optical source 10 which produce the lasing action, such as laser chip 24 and retroreflector assembly 34, are not affected when interchanging microcartridge 60 in order to change the wavelength of optical output 42.

Optical source 10 includes further advantages over prior art optical sources. For example, optical source 10 is compact and robust with all components of laser assembly 20 being fixedly attached to and contained or embedded in housing 22. Since optical output 42 is primarily determined by wavelength selective element 64 based on its wavelength selective properties independent of the specifications of laser assembly 20, the operation of laser assembly 20 by itself does not need to be stabilized to within the channel limits at which optical source 10 is to be used. Therefore, optical source 10 may be operated without a temperature controller and/or current controller. The need for a frequency locker, such as in the case of DFB lasers, is advantageously eliminated. For this reason, greater flexibility is available in choosing the operating temperature and output power of optical source 10. If a passive, thin film filter with low thermal coefficient is used, a temperature stability for the optical output wavelength of two picometer per ° C. or better can be achieved without the need for complex frequency locker schemes. Such thin film filters are also capable of being manufactured with bandwidths of 0.25 nm or better. Moreover, in another advantage, the elimination of the temperature controller, active heater/cooler and frequency locker circuitry significantly reduces the power consumption of optical source 10 as compared to prior art DFB optical sources.

The operational wavelength range of optical source 10 is mainly dependent on the properties of laser chip 24, high reflector coating on first end 28 and end reflector 36. By suitable selection of these components and appropriate design of wavelength selective element 64, optical source 10 is advantageously adaptable for operation over a broad array of wavelength ranges. Using currently available components in laser assembly 20, the wavelength range of optical output 42 may be chosen to cover ranges of 40 to 80 nm in the visible and infrared wavelengths. This operational wavelength range is comparable to the tuning range of many bulk grating, tunable lasers available on the market today. Remarkably, optical source 10 effectively achieves the same flexibility in output wavelength as the larger tunable lasers while exhibiting a much less complex structure. Still further advantages of the optical source of the present invention will be described immediately hereinafter.

Optical source 10 is particularly advantageous in a DWDM application where an optical source is needed for each channel over a specified range of wavelengths. Specifically, identical, generic laser assemblies 20, designed to operate over a contemplated range of wavelengths, are installed in each of a plurality of channels. To set each channel to its assigned wavelength, a specific microcartridge with the appropriate wavelength selective element is chosen and installed in each laser assembly 20. Since optical source 10 is based on a generic laser assembly, improved manufacturability is provided because an entire DWDM transmitter can be implemented with multiple channels over a specified range of wavelengths using identical, mass produced laser assemblies. In the field, a faulty laser assembly may readily be replaced by another generic laser assembly while using the microcartridge from the defective laser assembly. Furthermore, optical source 10 includes another advantage in that channel wavelength can be reprogrammed simply by exchanging the microcartridge without having to replace the entire optical source. Therefore, if the wavelength assignments for the channels in a DWDM system change, there is no need to reconfigure the entire DWDM transmitter or individual optical sources; a field technician can simply replace the existing microcartridges with other microcartridges corresponding to the new wavelength assignments. It is not necessary to keep a large stock of different laser sources for a variety of wavelengths.

An additional advantage associated with optical source 10 resides in the fact that, unlike DFB lasers which require external modulation in order to control frequency chirping, optical source 10 can be directly modulated since frequency chirp is naturally reduced in optical source 10. That is, with the use of a specially designed, wavelength selective element controlling the wavelength of the optical source output, frequency chirp is submitted to be substantially reduced.

It is noted that retroreflector assembly 34 may be fabricated using a graded index lens, such as the SELFOC lens manufactured by NSG America, Inc., with a reflective coating at one end serving as end reflector 36. By choosing, for example, a quarter-pitch SELFOC lens which focuses incoming, collimated light at end reflector 36, the ease of alignment of laser assembly 20 during manufacture can be enhanced with respect to possible misalignment of laser chip 24 and collimating lens 32 with retroreflector assembly 34.

As previously noted, the optical properties of wavelength selective element 64 and preset angle θ on microcartridge 60 are the primary variables that determine the wavelength of optical output 42 of optical source 10 given an implementation of laser assembly 20 designed to operate over a specified wavelength range. In order to improve the manufacturability of optical source 10, a set of generic, essentially identical wavelength selective elements is fabricated to be used over at least a portion of the specified wavelength range. Accordingly, the accuracy with which the wavelength selective element is positioned at the preset angle with respect to light path 40 becomes the determining factor in reliably and repeatably setting the wavelength of optical source 10 to a desired wavelength.

Still referring to FIG. 1, the positioning accuracy with regard to the wavelength selective element can be addressed in a number of ways. One possible way to ensure proper angular alignment of the wavelength selective element in the light path is to attach the wavelength selective element to the cover at a predetermined angle with respect to a reference direction on the cover. For example, the reference direction can be defined along a longitudinal direction parallel to the light path. The corresponding method of positioning of the wavelength selective element is referred to herein as a longitudinal alignment approach. In FIG. 1, the appropriate reference direction corresponds to line 66, which is parallel to light path 40. Wavelength selective element 64 is positioned on inner surface 65 of cover 62 such that surface normal 68 is aligned at a predetermined angle θ with respect to line 66. Inner surface 65, which contains line 66 and is parallel to light path 40, is designated as a coupling surface. At least one longitudinal alignment surface, also parallel to light path 40, is formed on the housing to cooperate with the coupling surface in such a way that the coupling surface lies flush against the longitudinal alignment surface when engaged against each other. Hermetic lid 46 and top surface 47 of housing 22 serve as the longitudinal alignment surfaces in optical source 10. It should be noted that the reference direction, the coupling surface and the longitudinal alignment surfaces are all defined to be parallel to light path 40. Therefore, by engaging the longitudinal alignment surfaces against the coupling surface, on which the wavelength selective element is mounted at the predetermined angle θ with respect to the reference direction, the wavelength selective element is positioned with sufficient accuracy at the predetermined angle with respect to light path 40. Furthermore, housing edges 49, surrounding the cartridge opening, cooperate with cover edges 69, around the periphery of the microcartridge, to prevent movement of the microcartridge in directions in the plane of the coupling surface once the coupling surface is engaged against the longitudinal alignment surfaces. Finally, microscrews 70 cooperate with matching holes 72a–d to secure microcartridge 60 onto housing 22 with the coupling surface, the longitudinal alignment surfaces and the housing and cover edges engaged in the aforedescribed manner. For greatest alignment accuracy, the alignment and reference dimensions should be taken along the greatest extents of the housing and microcartridge. Other alignment approaches will be described at appropriate points below.

Figure 2:
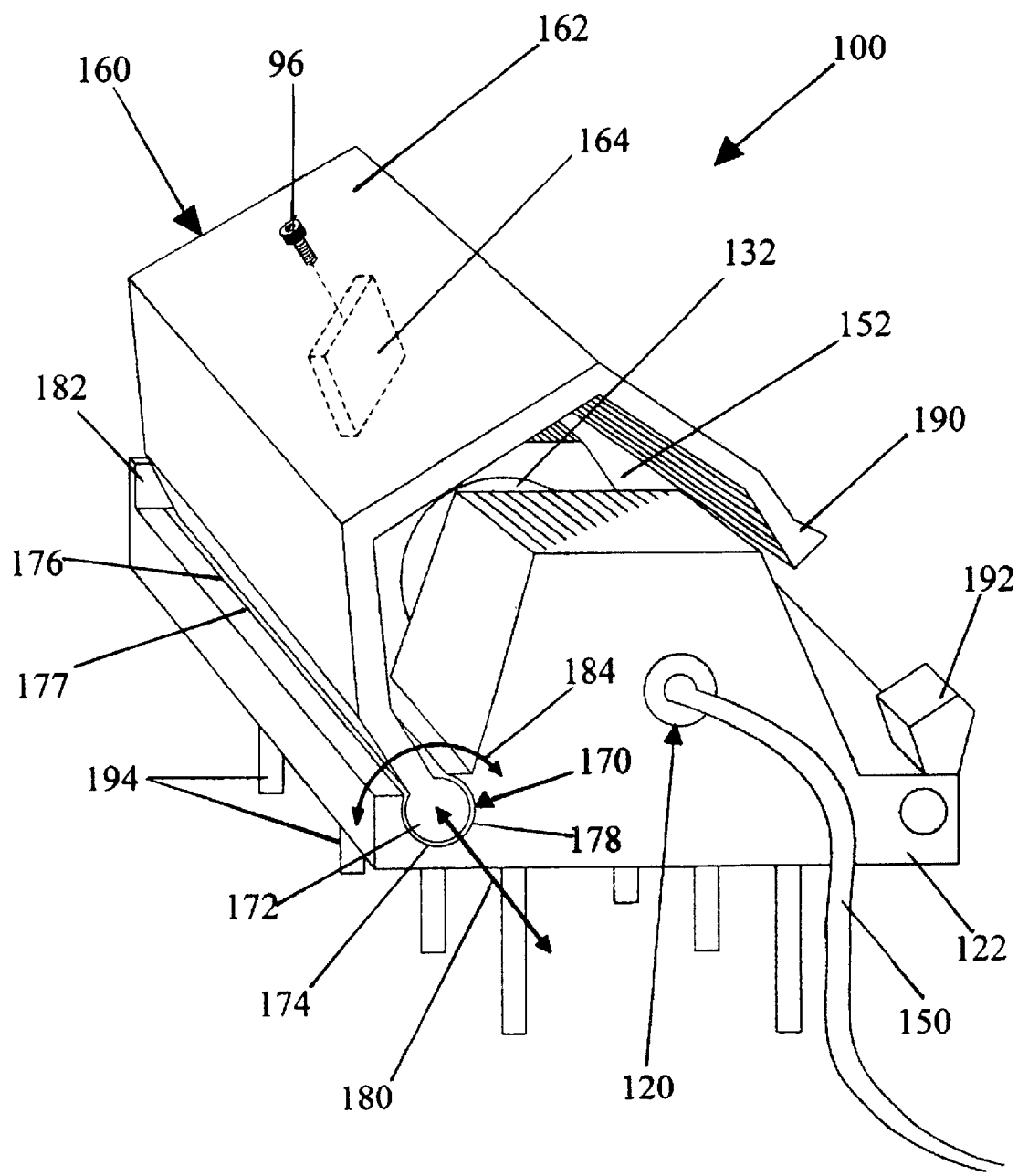
FIG. 2 is a diagrammatic perspective view showing another embodiment of an optical source manufactured in accordance with the present invention.

Attention is now directed to FIG. 2, which illustrates another optical source produced in accordance with the present invention, generally indicated by the reference number 100. Optical source 100 includes a laser assembly 120 which is supported in a housing 122. It should be appreciated that laser assembly 120 is functionally equivalent to previously described laser assembly 20 to the extent that it includes a housing 122 and other components that are not illustrated such as a laser chip with a high reflector coating on a first end and an anti-reflection coating on a second end, a laser submount and a retroreflector assembly including an end reflector. For this reason, the present discussion will center upon specific differences between optical sources 10 and 100. These differences relate primarily to the configuration of a microcartridge 160 and the way in which it engages housing 122, as will be described hereinafter.

Like laser assembly 20, laser assembly 120 is designed in such a way that a specified range of wavelengths is producible along a light path (not shown) in a laser cavity, both of which are defined between the high reflector coating on the first end of the laser chip and the end reflector included in the retroreflector assembly. A fiber pigtail 150 is attached to housing 122 in optical communication with the laser assembly in order to couple the optical output from the laser cavity to external optical devices. A gap 152 is defined by housing 122 between a collimating lens 132 and the retroreflector assembly (not visible) such that a portion of the light path passes through gap 152.

Microcartridge 160 includes a cover 162 and a wavelength selective element 164 attached to cover 162. A hinge assembly 170 is partially formed by housing 122 and partially formed by cover 162. An elongated hinge pin 172 is integrally formed along one edge of cover 162. A hinge groove 174 defines a cylindrical cavity 176 along one edge of housing 122 and an external hinge slot 177 with a width that is less than the diameter of cylindrical cavity 176. Cylindrical cavity 176 has a diameter which is just slightly larger than that of hinge pin 172 such that hinge pin 172 is slidable in cylindrical cavity 176 and an entrance slot 178 along direction indicated by double-headed arrow 180 while using external hinge slot 177. Microcartridge 160 is removed or installed, in part, using this slidable engagement. A stop 182 is formed at an opposing end of hinge groove 174 to impede the sliding motion of hinge pin 172 in cylindrical cavity 176 at a predetermined hinging position as shown. At the hinging position, hinge pin 172 is pivotally captured by hinge groove 174 for pivotal movement as indicated by arcuate arrow 184. At the hinging position, stop 182 serves to position wavelength selective element 164 along the direction of double headed-arrow 180 for aligned placement in gap 152. Thereafter, cover 162 is pivoted (not shown) per arcuate arrow 184 to close over housing 122. Cover 162 further includes a lip 190. A complementary latch member 192 is formed on housing 122. In the closed position, lip 190 and latch member 192 are resiliently biased against one another to an extent sufficient to capture cover 162 in place. At the same time, wavelength selective element 164 is positioned in the light path in gap 152 in such a way that the wavelength of the optical output is set to a desired wavelength out of the specified range of wavelengths.

Housing 122 also includes electrical contact pins 194 to provide electrical connections accommodating ease of installation of optical source 100. For example, by using pins 194, optical source 100 can readily be mounted onto a larger breadboard, such as in the case where optical source 100 is to be used as a part of a larger optical system. By standardizing the configuration of pins 194 and constructing a breadboard configured to receive several laser assemblies of the standard pin configuration, the task of assembling a complex device, such as a DWDM transmitter, using a number of laser assemblies and a series of microcartridges is readily accomplished. In and by itself, this aspect of the present invention is submitted to be highly advantageous. Each microcartridge is tuned to a particular wavelength from the specified range of wavelengths. Subsequently, the wavelength of the optical output of each optical source may be set to an alternative wavelength simply by releasing latch member 192, pivoting and sliding the installed microcartridge away from the housing, then replacing that microcartridge with an alternative microcartridge (not shown) tuned to set the wavelength of the optical output to the alternative wavelength. This process of establishing the output wavelength of the optical source may be performed as needed before or after the optical source has been installed in a DWDM transmitter.

Optical source 100 shown in FIG. 2, like optical source 10 illustrated FIG. 1, is another example of the longitudinal alignment approach to the controlling the position of the wavelength selective element in the light path. In the case of optical source 100, hinge groove 174 defining cylindrical cavity 176 at the edge of housing 122 serves as the longitudinal alignment surface oriented parallel to the light path. The surface of hinge pin 172 then becomes the coupling surface of microcartridge 160. Other surfaces of the housing and cover, which engage one another when the latter is in its closed position, help ensure proper angular orientation of the wavelength selective element in the light path. For example, surfaces of stop 182, lip 190 and latch member 192 serve in this capacity. Hinge assembly 170 and the combination of lip 190 and latch member 192 together serve to secure microcartridge 160 to housing 122. By orienting wavelength selective element 164 with respect to hinge pin 172 and engaging hinge pin 172 into hinge groove 174 until stopped by stop 182, then closing cover 162 over housing 122, wavelength selective element 164 can be accurately positioned in the light path.

Figure 3:
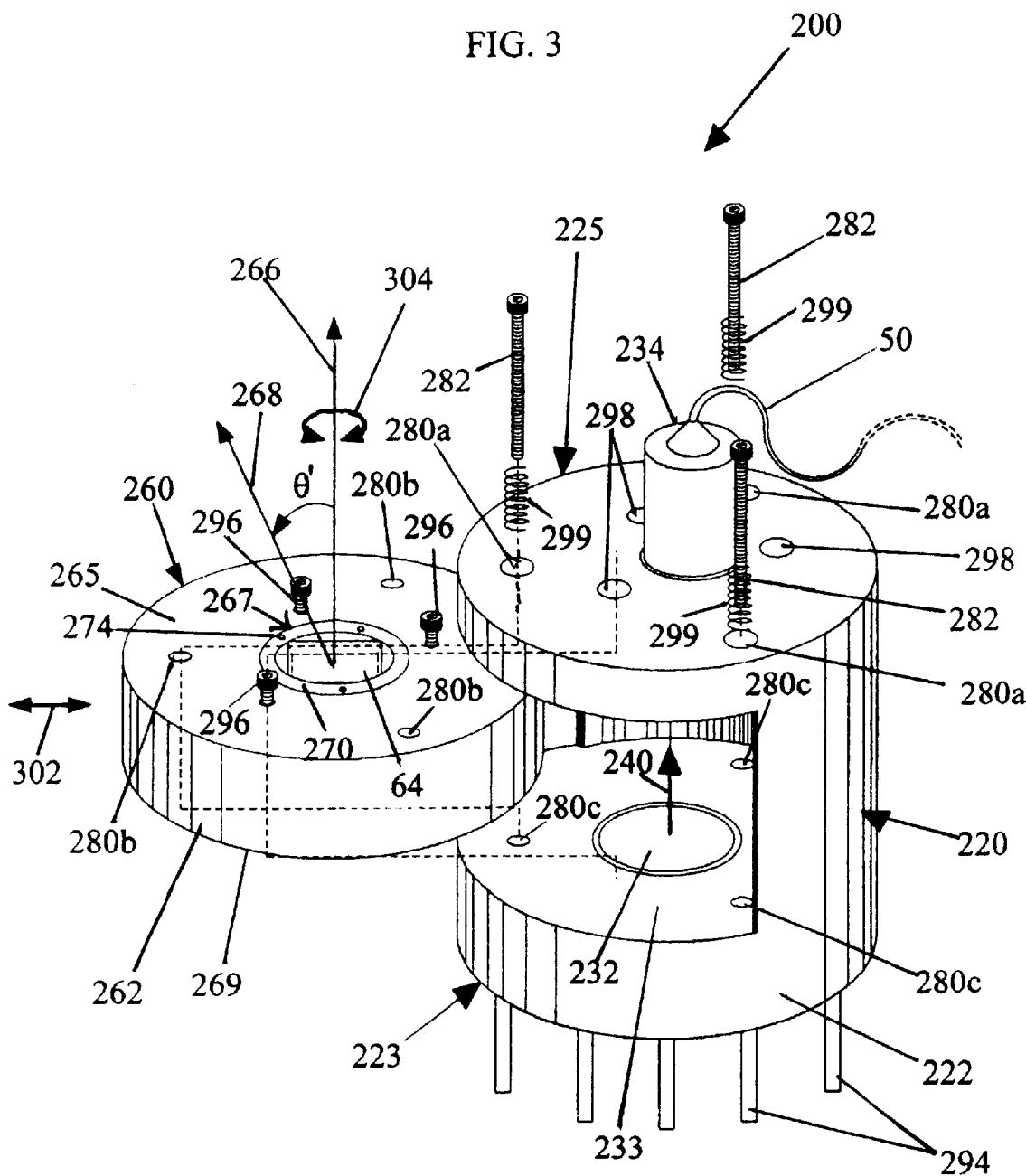
FIG. 3 is a diagrammatic exploded view, in perspective, showing still another embodiment of an optical source manufactured in accordance with the present invention.

Another programmable optical source, generally indicated by reference number 200 and manufactured in accordance with the present invention, is diagrammatically illustrated in FIG. 3. The latter is an exploded view showing optical source 200 in two separate sections: laser assembly 220 and a microcartridge 260.

Optical source 200 includes a housing 222 supporting a laser assembly 220. Laser assembly 220 includes a laser gain module 223 and a retroreflector module 225, both of which are supported by the housing. A collimating lens 232, as will be described in more detail hereinafter, is mounted in proximity to an inner surface 233 of laser gain module 223 to direct light out of laser gain module 223 toward retroreflector module 225 supported at the opposing end of housing 222 with respect to laser gain module 223. Preferably, collimating lens 232 is oriented in such a way that light potentially generated out of laser gain module 223 is directed perpendicularly with respect to inner surface 233. Pins 294 at a bottom surface of housing 222 allow the establishment of electrical contact between optical source 200 and external devices.

Figure 4:
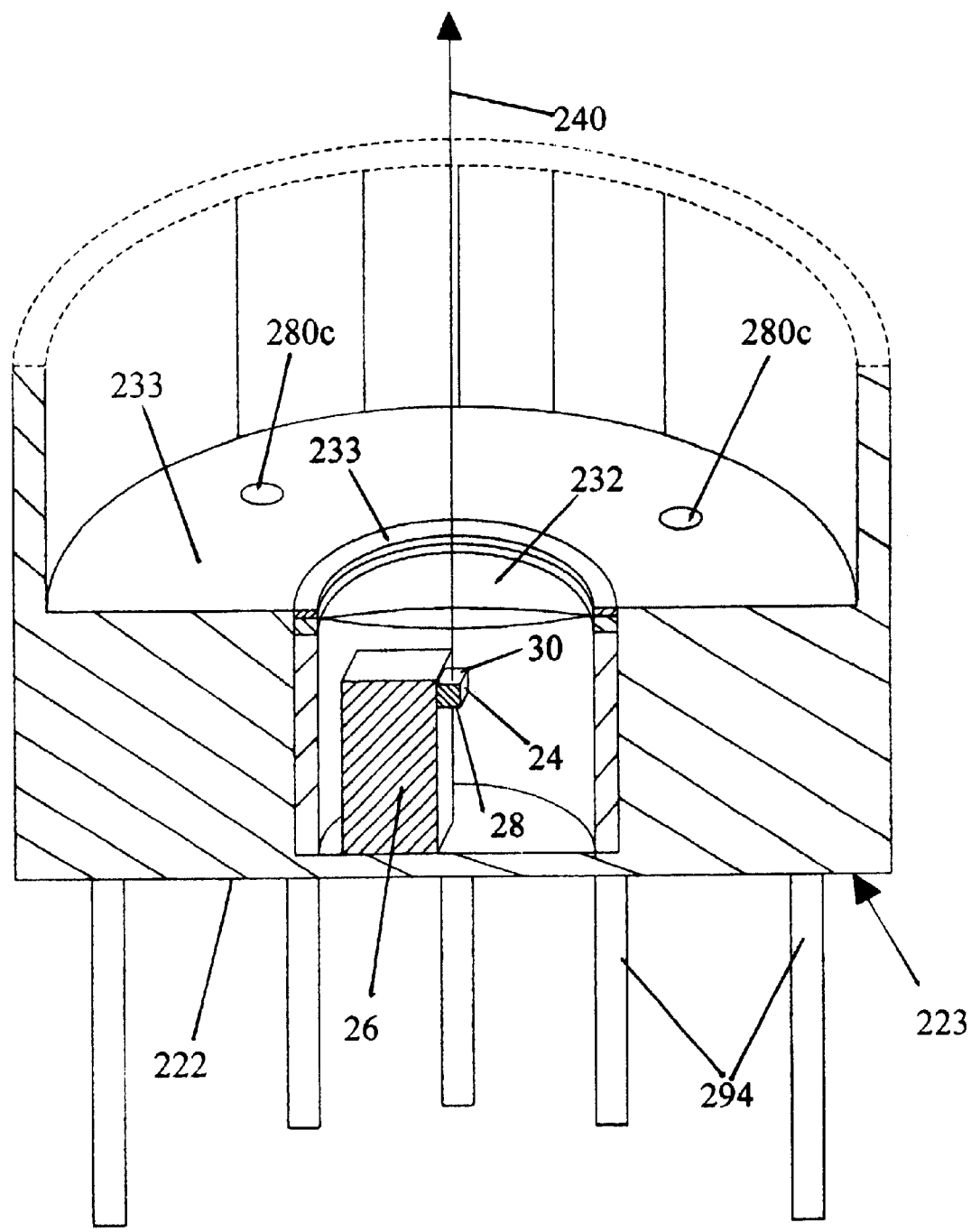
FIG. 4 is a perspective partial cut-away view, in elevation, of a portion of the optical source of FIG. 3 shown here to illustrate details of the internal structure of the optical source.

Turning to FIG. 4, which is a cut-away partial perspective view in elevation of laser gain module 223 shown in FIG. 3, attention is directed to components included within laser gain module 223. The overall outline of laser gain module 223 is defined by an end portion of housing 222. Laser gain module 223 includes laser chip 24 supported on a laser submount 26. The characteristics of laser chip 24 and laser submount 26 in FIG. 4 are essentially the same as those of the corresponding components shown in FIG. 1, including the properties of the high reflector coating on first end 28, the anti-reflection coating on second end 30 and the orientation of laser chip 24 with respect to a collimating lens 232. As mentioned in reference to FIG. 3, collimating lens 232 is positioned in such a way that light emitted from laser chip 24 is directed by collimating lens 232 toward retroreflector module 225. Preferably, light produced at laser chip 24 is directed perpendicularly with respect to inner surface 233 by collimating lens 232.

Referring now to FIG. 3 in conjunction with FIG. 4, retroreflector assembly 234, which is mounted on retroreflector module 225, contains end reflector 36. The latter is configured to cooperate with the high reflector coating on first end 28 of laser chip 24 in laser gain module 223 to define a laser cavity (not shown) and a light path 240 therebetween. Laser chip 24, the high reflector coating on first end 28 of laser chip 24 and end reflector 36 are designed to produce the previously mentioned, specified range of wavelengths along light path 240. A graded index lens such as, for example, a SELFOC lens (mentioned earlier in the discussion relating to FIG. 1), may be included in retroreflector assembly 234 for cooperating with collimating lens 232 to further stabilize the laser cavity. Fiber pigtail 50 is attached to one end of retroreflector assembly 234 in order to couple light out of optical source 200.

Figure 5:
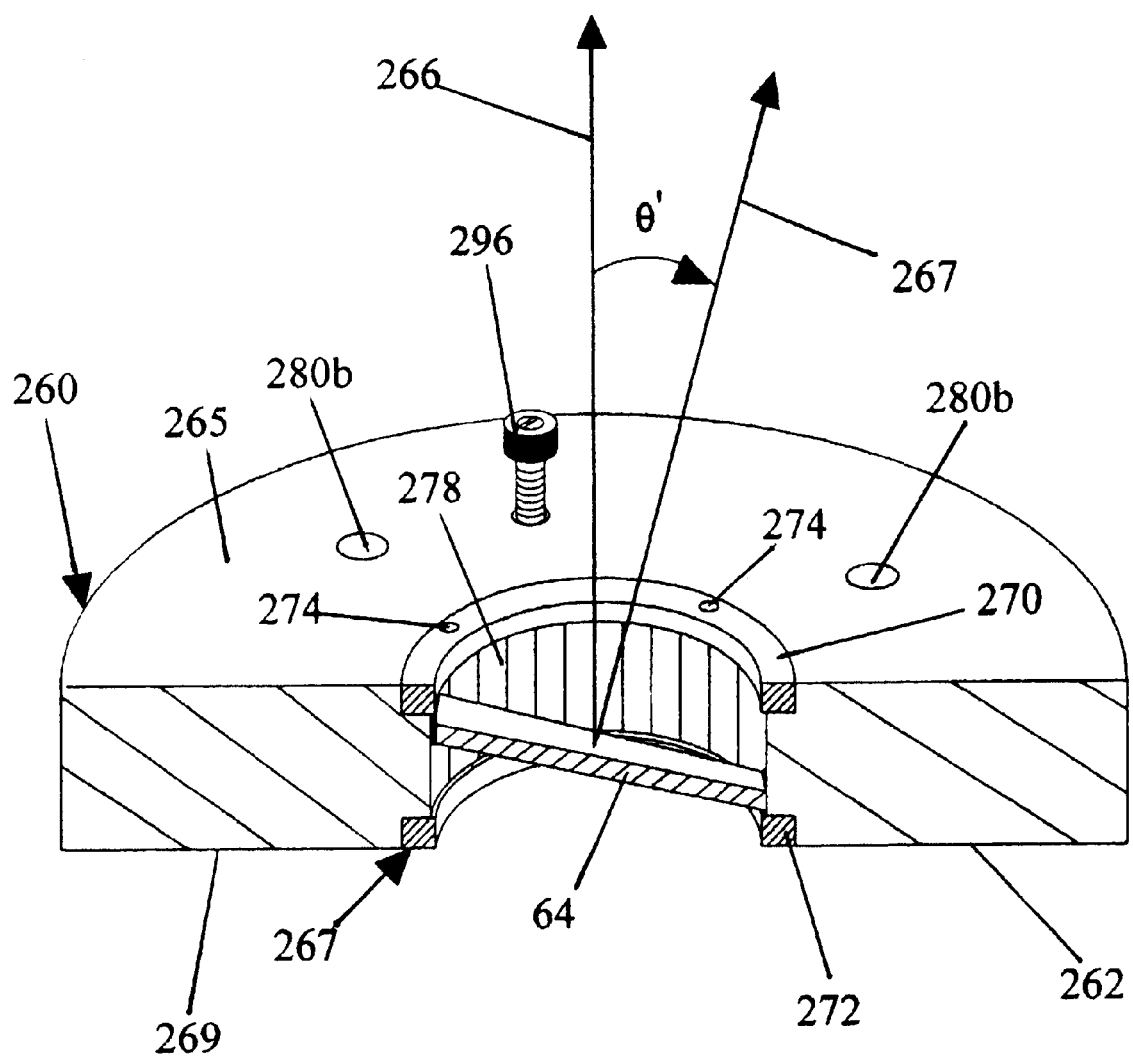
FIG. 5 is a perspective partial cut-away view, in elevation, of another portion of the optical source of FIG. 3 shown here to illustrate further details of the internal structure of the microcartridge of the optical source.

Referring to FIGS. 3 and 5, microcartridge 260 is designed to be captured in housing 222 between spaced apart laser gain module 223 and retroreflector module 225. This microcartridge includes wavelength selective element 64 supported in a filter housing 262. Wavelength selective element 64 is positioned in filter housing 262 in such a way that a microcartridge surface normal, taken with respect to a coupling surface 269 and indicated by arrow 266, makes an angle θ' with respect to a filter surface normal, indicated by arrow 268, of wavelength selective element 64. The position of wavelength selective element 64 in filter housing 262 may be secured using, for example, a support ring assembly 267. Coupling surface 269 is designed to cooperate with inner surface 233 of laser gain module 223 in such a way that coupling surface 269 lies flush against inner surface 233. With coupling surface 269 and inner surface 233 thus engaged, wavelength selective element 64 is positioned in light path 240 having filter surface normal 268 oriented at angle θ' with respect to light path 240 when microcartridge 260 is captured in housing 222. Coupling surface 269 may be parallel to a first microcartridge surface 265, as shown in FIG. 3. Alternatively, first microcartridge surface 265 can be shaped for installation and manufacturing convenience. For example, first microcartridge surface 265 may be sloped with respect to coupling surface 269 to form a wedge (not shown) for meet the needs of specific applications. Furthermore, matching holes 280a–c are defined in retroreflector module 225, microcartridge 260 and laser gain module 223 for securing the placement of microcartridge 260 with respect to housing 222 using screws 282. Holes 280a on retroreflector module 225 are designed to be slightly larger in diameter in comparison to holes 280b on microcartridge 260 and laser gain module 223 to allow the heads of screws 282 to pass through holes 280a in order to secure microcartridge 260 to laser gain module 223 while still allowing access to screws 282 through holes 280a. In other words, by using coupling surface 269, inner surface 233, holes 280a–c and screws 282, microcartridge 260 is captured in housing 222 in such a way that wavelength selective element 64 is reliably and stably positioned at angle θ' with respect to light path 240. Angle θ' is selected so as to set the wavelength of an optical output into fiber pigtail 50 from optical source 200 to a desired wavelength out of the previously mentioned, range of wavelengths present along light path 240 when microcartridge 260 is captured in housing 222 between laser gain module 223 and retroreflector module 225 in the aforementioned manner. That is, microcartridge 260, by appropriate selection of angle θ', is tuned to that desired wavelength. A series of microcartridges (not shown) may be fabricated, each microcartridge being tuned to a distinct wavelength out of the specified range of wavelengths, so that the wavelength of the optical output from optical source 200 may be set to any particular wavelength out of the specified range of wavelengths simply by interchanging the previously installed microcartridge with a microcartridge tuned to that particular wavelength.

Referring to FIG. 5, details regarding the positioning mechanism of wavelength selective element 64 are illustrated. As mentioned, wavelength selective element 64 is secured in filter housing 262 using support ring assembly 267. Support ring assembly 267 includes a top ring 270 and a bottom ring 272 which are secured onto filter housing 262 using a series of ring screws 274. The wavelength selective element may be fixedly attached to support ring 267 in any suitable manner. For instance, an adhesive material such as, for example, optical epoxy (not shown) can secure the wavelength selective element to an internal surface 278 of filter housing 262. By adjusting the amount of optical epoxy applied, the angle at which wavelength selective element 64 is supported within support ring assembly 267 is adjusted according to the desired wavelength to which the microcartridge is to be tuned during fabrication of the microcartridge. In this manner, angle θ' defined between microcartridge surface normal 266 and filter surface normal 268 can be set to any suitable angle by appropriately configuring the dimensions of wavelength selective element 64 and the diameter of support ring assembly 267 while using the required amount of optical epoxy to secure wavelength element 264 at the suitable angle. The resulting orientation of the wavelength selective element is secured relative to filter housing 262 using top ring 270 and bottom ring 272. It should be noted that any equivalent scheme of orienting wavelength selective element 64 at a predetermined angle within filter housing 262 may be applied without deviating from the spirit of the present invention.

Directing the reader's attention to FIG. 3, the process of interchanging the microcartridge to change the wavelength of optical source 200 may be performed before or after installation of optical source 200 in the field as in the instances of optical source 10 shown in FIG. 1 and optical source 100 illustrated in FIG. 2. It should be appreciated that optical source 200 shares all of the advantages of previously described optical sources 10 and 100 while providing additional advantages, as will be described in further detail hereinafter.

Optical source 200 as shown in FIG. 3 is an example of another approach to ensure proper alignment of the wavelength selective element by providing a transverse alignment surface in the housing. The transverse alignment surface is defined such that the plane of the transverse alignment surface is generally perpendicular to the light path. That is, the light path coincides with a surface normal of the transverse alignment surface. In this case, a coupling surface is defined on the microcartridge to be perpendicular, within a predetermined tolerance, to the light path. By orienting the wavelength selective element in the microcartridge in reference to the coupling surface and engaging the coupling surface with the transverse alignment surface in the housing, the wavelength selective element is positioned with sufficient accuracy in the light path. A suitable securing mechanism, such as matching holes and screws through the housing and microcartridge for example, is then used to secure the coupling surface against the transverse alignment surface while preventing motion of the microcartridge with respect to other dimensions of the housing. In the instance of optical source 200, light produced at laser chip 24 is directed perpendicularly with respect to inner surface 233 by collimating lens 232 such that light path 240 coincides with a surface normal of inner surface 233. Inner surface 233 of housing 222 serves as the transverse alignment surface designed to engage coupling surface 269 of microcartridge 260. Wavelength selective element 64 is oriented in support ring assembly 267 with respect to surface normal 266 of first microcartridge surface 265 (which is parallel to coupling surface 269) as shown in FIGS. 3 and 5. By engaging coupling surface 269 against inner surface 233 such that the two surfaces lie flat against each other, wavelength selective element 64 is positioned with sufficient accuracy in light path 40 to set the wavelength of the optical output of optical source 200 to the desired wavelength. Furthermore, springs 299 can be added to cooperate with screws 282 and holes 280*a–c* in such a way that, even when screws 282 are slightly loosened, coupling surface 269 of microcartridge 260 tends to lie flush against inner surface 233. Alternatively, an equivalent mechanism, such as a resilient washer or other materials (not shown), may be used in place of the spring-loading mechanism. Still further, holes 280*a–c* cooperate with screws 282 to prevent lateral movement, indicated by double-headed arrow 302, and radial movement, indicated by arcuate arrow 304, of microcartridge 260 with respect to housing 222 once the optical output wavelength is set to the desired wavelength by engaging coupling surface 269 against inner surface 233.

The aforedescribed examples of longitudinal alignment and transverse alignment approaches to the accurate positioning of the wavelength selective element represent only a few of many possible approaches and should be considered as illustrative and not restrictive. It is to be understood that other alignment approaches may be used while still practicing the present invention.

Continuing to refer to FIG. 3, optical source 200 further includes provisions for fine tuning the wavelength of the optical output of optical source 200 after microcartridge 260 has been installed in housing 222. To that end, a number of adjustment screws 296 are mounted through microcartridge 260 in such a way that the angle θ', at which wavelength selective element 64 is oriented with respect to light path 240, may be varied by turning one or more of the screws inward or outward. Access holes 298 are provided in retroreflector module 225 so as to allow access to adjustment screws 296 through retroreflector module 225 without having to first disengage microcartridge 260 from housing 222. The reader should bear in mind that screws 282 must be adjusted in conjunction with adjustment screws 296 since, as mentioned earlier, coupling surface 269 and inner surface 233 are at least initially intended to lie flush against one another. As described above, screws 282 may be accessed through holes 280*a* defined in retroreflector module 225, and screws 282 can be spring-loaded with springs 299 in such a way that, even when screws 282 are slightly loosened, coupling surface 269 of microcartridge 260 is resiliently biased against inner surface 233. The turning of adjustment screws 296 moves microcartridge 260 with respect to laser gain module 223, thus reorienting the angle at which wavelength selective element 64 is positioned in light path 240 and, as a result, changing the wavelength of the optical output of optical source 200 accordingly. Once the desired output wavelength is achieved, screws 282 are tightened once again to secure the microcartridge in the adjusted position. Although the actual output wavelength should be externally monitored at fiber pigtail 50 during this fine tuning process, such fine adjustment of the wavelength of the optical output may be desirable in cases where it is impractical to interchange microcartridge 260 or the new wavelength to which adjustment is desired is sufficiently close to the present output wavelength.

Referring again to FIG. 1, wavelength selective element 64 can also be mounted on cover 62 in such a way that the preset angle θ at which wavelength selective element 64 is oriented may be selectively varied before or after microcartridge 60 is mated with housing 22. For example, wavelength selective element 64 may be mounted using an adjustment screw 96 which may be turned to rotate wavelength selective element 64 in small increments. By monitoring the wavelength of optical output 42 through fiber pigtail 50 at a particular channel, the channel wavelength can be fine tuned simply by turning the adjustable screw. In other words, the wavelength of optical output 42 may be adjusted without disassembling or uninstalling optical source 10.

With reference to FIG. 2, a similar scheme may be implemented for optical source 100. For example, wavelength selective element 164 can also be mounted using adjustable screw 96 which may be used to vary the angle at which wavelength selective element 164 is oriented on cover 162, thus changing the output wavelength of optical source 100. This fine tuning feature adds flexibility to optical sources built according to the present invention and the feature is desirable in cases where, for example, a microcartridge tuned to the exact wavelength is not immediately available. The wavelength fine tuning adjustment may be performed in the factory or in the field such that response time to customer demands for optical sources of a variety of wavelengths can be further reduced. It should be noted, however, that the fine tuning feature is optional and not a required feature of the present invention.

Since the optical devices and associated method disclosed herein may be provided in a variety of different configurations and the method may be practiced in a variety of different ways, it should be understood that the present invention may be embodied in many other specific ways without departing from the spirit or scope of the invention. For example, a microcartridge may be configured in essentially unlimited number of ways to cooperate with a laser arrangement in a way which positions a wavelength selective element in a light path defined within the laser arrangement. As another example, a pre-filter, such as a sharp-peaked comb filter, can be permanently mounted onto the laser gain material such that the output of the laser arrangement is preset to a predetermined optical wavelength grid. In this case, the microcartridge may be configured to simply select the desired optical wavelength out of the optical wavelength grid, and the tolerances on the microcartridge and laser assembly component specifications can be relaxed. The wavelength selective element in this instance can have a flatter spectral shape rather than the sharp peak required if the pre-filter is not used. As yet another example, the optical output from the optical source may be extracted from the high reflector end of the laser chip rather than the retroreflector. For example, the fiber pigtail may be provided at the laser chip rather than the retroreflector assembly. This configuration may be advantageous in instances where testing of the optical source components during assembly of the optical source before the retroreflector is put in place. Still another example of a modification of the present invention is the use of two or more microcartridges simultaneously. The laser assembly may include provisions to accept two or more microcartridges, each microcartridge being designed to provide specific wavelength filtering characteristics such that the combination of microcartridges will produce an optical output of a desired wavelength. Such modifications are considered to be within the scope of the present invention so long as the teachings herein are applied. Therefore, the present examples are to be considered as illustrative and not restrictive, and the invention is not to be limited to the details given herein, but may be modified within the scope of the appended claims.

What is claimed is:

1. An optical apparatus comprising:
   a housing having an interior supporting therein a laser arrangement that is operative to produce laser light encompassing a specified range of wavelengths along a light path to a laser light output of said housing, said housing being configured to removably receive a selected one of a plurality of removable laser tuning cartridges containing respectively different wavelength-selective elements that are tuned to respectively different wavelengths within said specified range of wavelengths; and
   a respective removable laser tuning cartridge supporting a wavelength-selective element that becomes inserted into said light path of said laser light within said housing by a prescribed positioning of said respective removable laser tuning cartridge with respect to said housing, and thereby sets the wavelength of laser light emitted from said laser light output of said housing to a selected wavelength within said specified range of wavelengths.

2. The apparatus according to claim 1, wherein said respective removable laser tuning cartridge supports said wavelength-selective element at a prescribed orientation, such that, upon said prescribed positioning of said respective removable laser tuning cartridge with respect to said housing, said wavelength-selective element intersects said light path at a preset angle.

3. The apparatus according to claim 2, wherein said respective removable laser tuning cartridge includes an adjustment mechanism for varying the orientation of said wavelength-selective element with respect to said light path over a plurality of different angles, subsequent to said respective removable laser tuning cartridge having been inserted into said light path of said laser light within said housing by said prescribed positioning of said respective removable laser tuning cartridge with respect to said housing.

4. The apparatus according to claim 1, wherein said adjustment mechanism includes at least one adjustment element.

5. The apparatus according to claim 4, wherein said adjustment mechanism includes a spring-biased arrangement that is configured to cooperate with said at least one adjustment element, so that said respective removable laser tuning cartridge is resiliently biased against said housing.

6. The apparatus according to claim 1, wherein said respective removable laser tuning cartridge includes a cover that supports said wavelength-selective element, said cover being configured to close said interior of housing and thereby form with said housing form an overall package outline of said apparatus.

7. The apparatus according to claim 6, further including a latching arrangement partially formed by said cover and partially formed by said housing and which resiliently closes said cover against said housing.

8. The apparatus according to claim 1, wherein said wavelength-selective element comprises a passive wavelength filter.

9. The apparatus according to claim 8, wherein said passive wavelength filter has a thermal expansion coefficient of less two pm/° C.

10. The apparatus according to claim 8, wherein said passive wavelength filter comprises a thin film wavelength division multiplex filter.

11. The apparatus according to claim 1, wherein said housing has a longitudinal alignment surface oriented parallel to said light path, and said respective removable laser tuning cartridge has a coupling surface that cooperates with said longitudinal alignment surface of said housing such that, when said coupling surface of said respective removable laser tuning cartridge securely engages said longitudinal alignment surface of said housing, said wavelength-selective element is positioned in said light path and sets the wavelength of laser light emitted from said laser light output of said housing to said selected wavelength within said specified range of wavelengths.

12. The apparatus according to claim 1, wherein said housing has a transverse alignment surface oriented such that a plane containing said transverse alignment surface is perpendicular to said light path, and said respective removable laser tuning cartridge has a coupling surface that cooperates with said longitudinal alignment surface of said housing such that, when said coupling surface of said respective removable laser tuning cartridge securely engages said longitudinal alignment surface of said housing, said wavelength-selective element is positioned in said light path and sets the wavelength of laser light emitted from said laser light output of said housing to said selected wavelength within said specified range of wavelengths.

13. The apparatus according to claim 1, wherein said interior of said housing contains a pre-filter that is configured to pass a pre-selected plurality of wavelengths of said specified range of wavelengths including said selected wavelength, such that upon said prescribed positioning of said respective removable laser tuning cartridge with respect to said housing, said wavelength-selective element filters said selected wavelength from among said pre-selected plurality of wavelengths.

14. The apparatus according to claim 1, further including a light transmissive element disposed in said light path and being operative to allow said specified range of wavelengths to pass therethrough.

15. The apparatus according to claim 14, wherein said light transmissive element comprises a collimating lens.

16. The apparatus according to claim 14, wherein said light transmissive element comprises an aspherical lens.

17. The apparatus according to claim 14, wherein said laser arrangement includes a semiconductor laser chip.

18. The apparatus according to claim 14, wherein said laser arrangement includes an optical fiber amplifier.

19. A method of generating a laser light output beam having a selected wavelength comprising the steps of:

(a) providing a housing containing a laser arrangement that is operative to produce a laser light beam having a specified range of wavelengths along a laser light beam path to a laser light beam output of said housing, said housing being configured to removably receive a selected one of a plurality of removable laser light beam tuning cartridges containing respectively different wavelength-selective elements that are tuned to respectively different wavelengths within said specified range of laser light beam wavelengths;

(b) providing a plurality of removable laser light beam tuning cartridges respectively containing different wavelength-selective elements that are oriented so as to be insertable into said laser light path beam of said laser light beam within said housing by a prescribed positioning of a respective removable laser light beam tuning cartridge with respect to said housing; and (c) engaging said housing with a selected one of said plurality of removable laser tuning cartridges containing a wavelength-selective element tuned to said selected wavelength, and thereby inserting said wavelength-selective element tuned to said selected wavelength into said laser light path beam within said housing and tune said laser light beam output to said selected wavelength.

20. The method according to claim 19, wherein step (a) includes inserting within said housing a pre-filter that is configured to pass a pre-selected plurality of wavelengths of said specified range of wavelengths including said selected wavelength, such that upon engaging said housing with said selected removable laser tuning cartridge in step (c), said wavelength-selective element filters said selected wavelength from among said pre-selected plurality of wavelengths.

21. The method according to claim 19, further including the steps of:

(d) disengaging said housing from said selected one of said plurality of removable laser tuning cartridges; and (e) engaging said housing with another of said plurality of removable laser tuning cartridges containing another wavelength-selective element tuned to another selected wavelength, and thereby inserting said another wavelength-selective element tuned to said another selected wavelength into said laser light path beam within said housing and tune said laser light beam output to said another selected wavelength.

22. The method apparatus according to claim 19, further including the step of:

(d) varying the orientation of said wavelength-selective element with respect to said laser light beam path subsequent to engaging said housing with said selected removable laser beam tuning cartridge.

23. The method apparatus according to claim 22, wherein step (d) includes varying the orientation of said wavelength-selective element by means of a spring-biased arrangement.

24. The method according to claim 19, wherein said wavelength-selective element is a passive wavelength filter.

25. The method according to claim 24, wherein said passive wavelength filter has a thermal expansion coefficient of less two pm/° C.

26. The method according to claim 24, wherein said passive wavelength filter comprises a thin film wavelength division multiplex filter.

27. The method according to claim 19, wherein said housing has a longitudinal alignment surface oriented parallel to said light path, and said respective removable laser tuning cartridge has a coupling surface that cooperates with said longitudinal alignment surface of said housing such that, when said coupling surface of said respective removable laser tuning cartridge securely engages said longitudinal alignment surface of said housing in step (c), said wavelength-selective element is positioned in said light path and sets the wavelength of laser light emitted from said laser light output of said housing to said selected wavelength within said specified range of wavelengths.

28. The method according to claim 19, wherein said housing has a transverse alignment surface oriented such that a plane containing said transverse alignment surface is perpendicular to said light path, and said respective removable laser tuning cartridge has a coupling surface that cooperates with said longitudinal alignment surface of said housing such that, when said coupling surface of said respective removable laser tuning cartridge securely engages said longitudinal alignment surface of said housing in step (c), said wavelength-selective element is positioned in said light path and sets the wavelength of laser light emitted from said laser light output of said housing to said selected wavelength within said specified range of wavelengths.

29. The method according to claim 19, further including a light transmissive element disposed in said light path and being operative to allow said specified range of wavelengths to pass therethrough.

30. The method according to claim 29, wherein said light transmissive element comprises a collimating lens.

31. The method according to claim 29, wherein said light transmissive element comprises an aspherical lens.

32. A wavelength division multiplex optical communication system comprising a plurality of housings, each containing a laser arrangement that is operative to produce a respective laser light beam having a range of wavelengths along a respective laser light beam path to a laser light beam output of said each housing, said each housing removably receiving a respectively different one of a plurality of removable laser light beam tuning cartridges containing respectively different wavelength-selective elements that are tuned to respectively different wavelengths within said specified range of laser light beam wavelengths, and thereby inserting respective wavelength-selective elements tuned to respectively different wavelengths into said laser light path beams within said housings and tuning laser light beam outputs thereof to said respectively different wavelengths, and thereby provide a plurality of output laser light beam output channels tuned to said respectively different wavelengths.

33. The wavelength division multiplex optical communication system according to claim 32, wherein said each removable laser tuning cartridge supports a respective wavelength-selective element at a prescribed orientation, such that, upon positioning of said respective removable laser tuning cartridge with respect to said each housing, said wavelength-selective element intersects said light path at a preset angle.

34. The wavelength division multiplex optical communication system according to claim 32, wherein said removable laser tuning cartridge includes an adjustment mechanism for varying the orientation of said wavelength-selective element with respect to said light path over a plurality of different angles, subsequent to said removable laser tuning cartridge having been inserted into said light path of said laser light within said each housing by positioning of said respective removable laser tuning cartridge with respect to said each housing.

35. A method of generating a plurality of optical channels having respectively different wavelengths for use with a wavelength division multiplex optical communication system comprising the steps of:

(a) providing a plurality of housings, each containing a laser arrangement that is operative to produce a respective laser light beam having a range of wavelengths along a respective laser light beam path to a laser light channel output of said each housing; and (b) removably engaging respective ones of said housings with respectively different ones of a plurality of removable laser light beam tuning cartridges containing respectively different wavelength-selective elements that are tuned to respectively different wavelengths, and thereby inserting respective wavelength-selective elements tuned to respectively different wavelengths into said laser light path beams within said housings, and tuning laser light beams thereof to said respectively different wavelengths, and thereby provide a plurality of output laser light beam output channels tuned to said respectively different wavelengths.

36. The method according to claim 35, wherein each removable laser tuning cartridge supports a respective wavelength-selective element at a prescribed orientation, such that, upon positioning of said respective removable laser tuning cartridge with respect to said each housing, said wavelength-selective element intersects said light path at a preset angle.

37. The method according to claim 35, wherein said removable laser tuning cartridge includes an adjustment mechanism for varying the orientation of said wavelength-selective element with respect to said light path subsequent to insertion of said removable laser tuning cartridge into said laser light beam path within each housing by engagement of said respective removable laser tuning cartridge with a respective housing.

38. The method according to claim 35, further including the steps of:

(c) disengaging a selected housing from one of said plurality of removable laser tuning cartridges; and (d) engaging said selected with another removable laser tuning cartridges containing another wavelength-selective element tuned to another selected wavelength, and thereby inserting said another wavelength-selective element tuned to said another selected wavelength into a laser light path beam within selected housing and tuning said laser light beam output channel to said another selected wavelength.

39. The method apparatus according to claim 35, further including the step of:

(d) varying the orientation of one or more of the wavelength-selective elements of said plurality of cartridges with respect to laser light beam paths of respective housings subsequent to engaging said respective housings with said plurality of laser beam tuning cartridges.

40. An optical apparatus comprising:

a housing having an interior supporting therein a laser. arrangement that is operative to produce laser light encompassing a specified range of wavelengths along a light path to a laser light output of said housing, said housing being configured to removably receive a plurality of removable laser tuning cartridges containing respective wavelength-selective elements that are operative to provide specific light filtering characteristics within said specified range of wavelengths; and a plurality of removable laser tuning cartridges supporting said respective wavelength-selective elements that become inserted into said light path of said laser light within said housing by a prescribed positioning of said respective removable laser tuning cartridges with respect to said housing, and thereby combine to set the wavelength of laser light emitted from said laser light output of said housing to a selected wavelength within said specified range of wavelengths.

* * * * *